United States Patent
Kraus et al.

(10) Patent No.: US 6,740,252 B2
(45) Date of Patent: May 25, 2004

(54) RUTHENIUM SILICIDE WET ETCH

(75) Inventors: Brenda D. Kraus, Boise, ID (US); Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/165,801

(22) Filed: Jun. 7, 2002

(65) Prior Publication Data

US 2002/0148998 A1 Oct. 17, 2002

Related U.S. Application Data (62) Division of application No. 09/799,791, filed on Mar. 5, 2001, now Pat. No. 6,498,110.

(51) Int. Cl.$^7$ .................. C09K 13/00; C09K 13/04; H01L 21/302
(52) U.S. Cl. .................. 252/79.1; 252/79.2; 438/745
(58) Field of Search .................. 252/79.1, 79.2, 252/79.3; 438/745

(56) References Cited

U.S. PATENT DOCUMENTS

| | | | |
|---|---|---|---|
| 3,791,948 A | * | 2/1974 | Dixon et al. .................. 205/656 |
| 3,968,565 A | | 7/1976 | Bertens et al. .................. 438/3 |
| 4,199,337 A | | 4/1980 | Asam .................. 65/428 |
| 6,399,492 B1 | * | 6/2002 | Anfreas et al. .................. 438/682 |

FOREIGN PATENT DOCUMENTS

| | | |
|---|---|---|
| GB | 817123 | 7/1959 |
| JP | 09279189 | 10/1997 |
| WO | WO 00/13215 | 3/2000 |

OTHER PUBLICATIONS

Ding et al., Multiple elements chemical etching agent for nickel–titanium alloy film (English Abstract of CN 1242438), Jan. 26, 2000, 2 pages.*

* cited by examiner

*Primary Examiner*—Nadine G. Norton
*Assistant Examiner*—Lynette T. Umez-Eronini
(74) *Attorney, Agent, or Firm*—Knobbe Martens Olson & Bear LLP (57) ABSTRACT

A method of removing ruthenium silicide from a substrate surface which comprises exposing the ruthenium silicide surface to a solution containing chlorine and fluorine containing chemicals. In particular, said solution is designed to react with said ruthenium silicide film such that water-soluble reaction products are formed.

5 Claims, 5 Drawing Sheets

ETCH RATE vs. KOCl VOLUME PORTION FOR FOUR DIFFERENT HF CONCENTRATIONS

FIG. 5

Etch rate vs. HF volume portion at 6% KOCl portion

RUTHENIUM SILICIDE WET ETCH

RELATED APPLICATIONS

This application is a divisional application of and claims priority to Ser. No. 09/799,791 now U.S. Pat. No. 6,498,110 filed Mar. 5, 2001, entitled "Ruthenium Suicide Wet Etch."

BACKGROUND OF THE INVENTION

1. Field of the Invention

This invention relates to silicon integrated circuit processing and, more particularly, to a process for selectively removing ruthenium silicide from a semiconductor substrate.

2. Description of the Related Art

Semiconductor devices are typically made up of varying levels of components, each of which are formed from different materials. During the process of fabricating a semiconductor device, the device layers are repeatedly subjected to high temperature processes that can result in diffusion of species between layers. Diffusion of species of atoms or molecules, such as oxygen, for example, can result in degraded performance of different components of the semiconductor device. This problem occurs in a number of different semiconductor devices such as interconnects or capacitors.

A capacitor structure within an integrated circuit typically comprises an insulating dielectric layer sandwiched between a lower and upper conducting electrode. This provides the capacitor structure with a desired capacitance C, that varies proportionally with the dielectric constant, k, of the dielectric layer and the area, A, of the electrodes. However, due to the limitations of known manufacturing methods, the typical dielectric layer often suffers from a substantially large concentration of oxygen vacancy defects. In particular, an oxygen vacancy exists whenever the crystal structure of an oxide dielectric is missing an oxygen atom. Unfortunately, the presence of oxygen vacancies within the dielectric causes the dielectric layer to have a decreased dielectric constant as well as a decreased electrical resistance. Thus, a capacitor structure formed of such a dielectric layer usually provides a decreased capacitance, thereby reducing the charge deposited on the electrodes of the capacitor structure in response to a specific voltage differential applied across the electrodes.

Furthermore, the problems associated with oxygen vacancies within dielectric materials are becoming more apparent as integrated circuits are formed with increasingly smaller circuit elements. For example, high density Dynamic Random Access Memory (DRAM) devices requiring a large number of capacitor structures demand the electrodes of each capacitor structure to have a relatively small area. Thus, in order to provide a sufficient capacitance in response to the reduced area, A, of the electrodes, dielectric materials having a relatively large dielectric constant, k, otherwise known as high-k dielectric materials, are required. However, known high-k dielectric materials, such as tantalum pentoxide ($Ta_2O_5$), barium strontium titanate (BST), barium titanate (BT) lead zirconium titanate (PZT), and strontium bismuth tantalate (SBT), require the presence of oxygen atoms throughout their crystal structures. Furthermore, the dielectric constant and the electrical resistance of these high-k materials are especially sensitive to the presence of oxygen vacancies. Thus, these capacitor structures are more likely to be formed with an insufficient capacitance for developing a detectable charge as well as an insufficient resistance for maintaining the detectable charge.

To address the problem of oxygen vacancies in dielectric materials, manufacturers often subject DRAM integrated circuits to re-oxidation anneals. For example, DRAM integrated circuits are usually exposed to an annealing process which heats the integrated circuit in an oxidizing environment subsequent to the deposition of the dielectric material and prior to the deposition of the upper electrode so as to source oxygen atoms to the exposed dielectric material to thereby reduce the concentration of oxygen deficiencies. Disadvantageously, however, during the annealing operation the oxygen is known to diffuse through the dielectric layer and seep into the underlying bottom electrode, thus adversely affecting the electrical properties of the electrode.

In particular, the bottom electrode is typically formed on a silicon based substrate surface and the silicon is known to migrate upwardly from the substrate surface into the bottom electrode. During the annealing operation, silicon that has diffused upwardly into the bottom electrode can react with the oxygen to form silicon dioxide ($SiO_2$). The formation of silicon dioxide in the bottom electrode is undesirable as it has shown to result in open contacts. This problem is especially prevalent in capacitors having bottom electrodes made of platinum, ruthenium oxide, or other metals that are particularly susceptible to silicon permeation.

To address this problem, a barrier layer can be interposed between the bottom electrode and the underlying silicon substrate surface to inhibit silicon from diffusing upwardly into the bottom electrode. In fact, one such method is disclosed in U.S. Pat. No. 6,197,628 assigned to Micron Technology which teaches using a ruthenium silicide ($RuSi_x$) liner as a silicon diffusion barrier in Metal-Insulator-Metal (MIM) capacitor modules. As described in the above mentioned U.S. Patent, ruthenium suicide ($RuSi_x$) is preferably deposited onto the silicon substrate surface using a chemical vapor deposition (CVD) method that is well known in the art. However, the CVD process is known to deposit $RuSi_x$ on the edges and backside of the wafer as well as any other unmasked surfaces such as clamping tools or other equipment used during deposition. As a consequence, the excessive $RuSi_x$ deposits have to be removed from the substrate surface prior to completion of wafer processing.

Although a number of etchants have been developed for removing ruthenium metal, there is presently no known chemistry that can effectively remove ruthenium silicide in bulk. Since the use of ruthenium silicide as a barrier liner is a relatively novel idea that shows potential for a wide range of applications in semiconductor fabrication, it can be appreciated that an appropriate etchant for removing ruthenium silicide is highly desired. Hence from the foregoing, it will be appreciated that there is a need for an etchant that can effectively remove ruthenium silicide. To this end, this is a particular need for an etching process that is simple, cost effective, and can selectively remove ruthenium silicide in bulk from a substrate surface.

SUMMARY OF THE INVENTION

The aforementioned needs are satisfied by the present invention which teaches a method of selectively removing ruthenium silicide ($RuSi_x$) from a surface. In one aspect, the present invention comprises a method of using chlorine and fluorine containing chemicals to remove $RuSi_x$ from a surface. In particular, the method comprises exposing the surface containing ruthenium silicide to a solution containing chlorine and fluorine containing chemicals such that the solution reacts with the ruthenium silicide film to form water-soluble reaction products. Furthermore, subsequent to reacting ruthenium silicide with said solution, the method comprises rinsing the surface to further dissolve and remove reactants and products formed as a result of the interaction between $RuSi_x$ and the etching solution.

In one embodiment, the surface containing ruthenium silicide is exposed to an aqueous solution containing chlorine- and fluorine-containing chemicals. Furthermore, the same aqueous solution is used to dissolve and remove the reaction products so that the formation and dissolution of soluble products can be performed in the same reaction tank using substantially the same solution. However, in other embodiments, chlorine- and fluorine-containing chemicals may be obtained from a gaseous source and a separate aqueous solution may be used to dissolve and flush the reaction products remaining on the surface. For instance, chlorine gas can be mixed with HF solution and water to form the etchant solution. Alternatively, the etchant solution can be prepared by bubbling $Cl_2$ and HF gas into water.

In another aspect, the present invention comprises a hypochlorite salt based solution that can selectively etch $RuSi_x$ from a substrate surface. In one embodiment, the solution may comprise approximately 0.6% potassium hypochlorite (KOCl), 0.7% hydrofluoric acid (HF), and 98.7% D.I. water by weight. In another embodiment, the solution comprises KOCl, HF, and water combined in the volume ratio of 3:1:50 respectively. Furthermore, the KOCl and HF used in this embodiment are off-the-shelf aqueous solutions premixed at concentration levels of 11% and 49% respectively.

Advantageously, the ingredients of the solution are relatively inexpensive and commonly available. Furthermore, the solution can be made using conventional laboratory techniques that are simple and convenient to implement.

In yet another aspect, a method of removing ruthenium silicide ($RuSi_x$) from a substrate surface is provided wherein the method comprises exposing the $RuSi_x$ to a hypochlorite salt based solution. In one embodiment, the $RuSi_x$ is immersed in the hypochlorite salt based solution for approximately 1–10 minutes. Furthermore, the hypochlorite salt based solution comprises potassium hypochlorite, hydrofluoric acid, and D.I. water combined in the volume ratio of 3:1:50 respectively using 11% KOCl and 49% HF aqueous solutions. The solution effectively dissolves the $RuSi_x$ on the substrate surface and the substrate surface may comprise the back side, edges, or recessed areas on a wafer. Advantageously, the etching process does not require specialized equipment or techniques as the substrates can be batch processed in open tanks that are commonly used in wet chemistry processing. Of course, the same process chemistry can be applied through many wet process tools available to those skilled in the art. These tools include but are not limited to, spray process, spin etch, and brush scrub process technologies.

In yet another aspect, the present invention provides a method of selectively removing ruthenium silicide ($RuSi_x$) from a substrate surface without substantially affecting other non-$RuSi_x$ areas that are not masked with photoresist or other coating. In particular, the method uses a hypochlorite salt based solution that is capable of selectively etching $RuSi_x$ from a surface without adversely affecting other exposed material, such as oxide layers or the like. Furthermore, one or both sides of the substrate surface may be selectively processed. In one embodiment, the edge of the wafer is selectively processed in a spin-etch tool. Advantageously, the solution is formulated to remove $RuSi_x$ at a much faster rate than it removes other material on the substrate surface, which in most instances effectively obviates the need of masking the substrate surface to protect other material on the substrate from the etchant.

Advantageously, the present invention provides an etchant that can effectively remove ruthenium silicide ($RuSi_x$) from a substrate surface while there is presently no other chemicals known in the art that is able to even marginally etch $RuSi_x$. In fact, the use of $RuSi_x$ itself is relatively novel in semiconductor fabrication and its numerous advantages are disclosed in the above mentioned copending application. However, it can be appreciated that these advantages cannot be fully realized without an effective method of removing excess $RuSi_x$ from the substrate surface. Thus, the present invention fulfills an important need by providing a relatively simple and cost-effective method of removing ruthenium silicide from a substrate surface so that $RuSi_x$ can be widely used in integrated circuit fabrication. Furthermore, the method can be adapted to selectively remove $RuSi_x$ from a substrate surface without masking the substrate which further reduces the number of processing steps and the risk of incurring defects.

From the foregoing, it will be appreciated that the aspects of the present invention provide a method of selectively removing ruthenium silicide ($RuSi_x$) from a substrate surface. In particular, the invention provides a novel method of etching $RuSi_x$ by exposing the $RuSi_x$ to a hypochlorite salt based solution wherein the solution effectively dissolves the $RuSi_x$ without noticeably affecting other material on the substrate surface. These and other advantages of the present invention will become more apparent from the following description taken in conjunction with the following drawings.

DETAILED DESCRIPTION OF THE PREFERRED EMBODIMENT

Reference will now be made to the drawings wherein like numerals refer to like parts throughout. As will be described hereinbelow, the process of the preferred embodiment provides a method of using chlorine and fluorine containing solutions to remove ruthenium silicide ($RuSi_x$) from a substrate surface.

Figure 1:
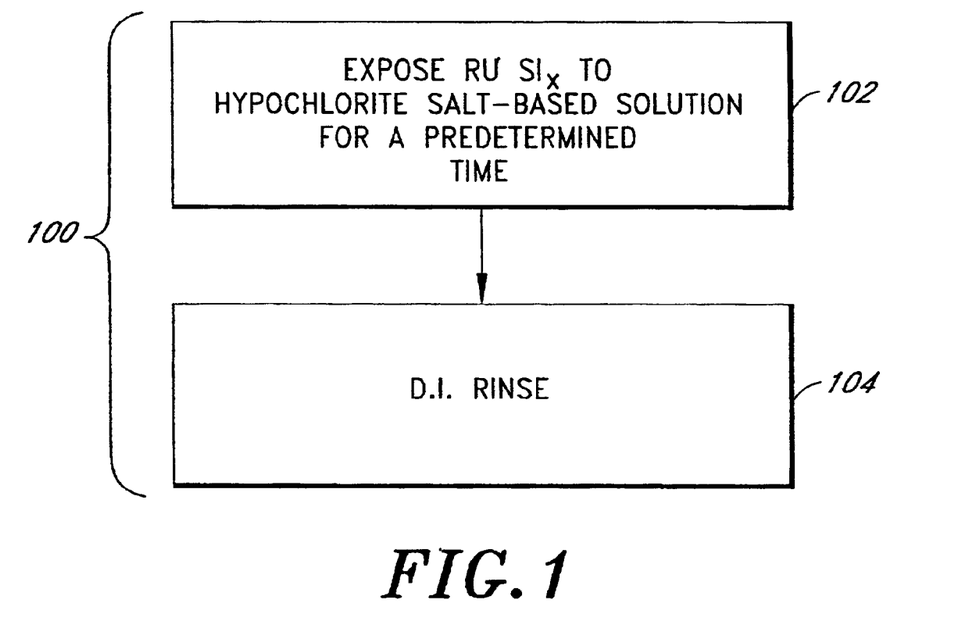
FIG. 1 is a flow diagram illustrating a process flow for removing ruthenium silicide from a substrate surface in accordance with a preferred embodiment of the present invention.

FIG. 1 schematically illustrates a process flow 100 of the preferred embodiment of selectively ruthenium silicide ($RuSi_x$) from a surface. As shown in FIG. 1, the process begins with a first step 102 comprising exposing the ruthenium silicide to a hypochlorite salt based solution for a predetermined time. Preferably, the solution comprises potassium hypochlorite (KOCl) combined with hydrofluoric acid (HF) and D.I. water in the volume ratio of 3:1:50 (KOCl HF D.I. $H_2O$) using 11% KOCl and 49% HF aqueous solutions. In another embodiment, the solution comprises approximately 0.1–1.0% KOCl, 0.2–2.0% HF, and balance D.I. water by weight. However, it can be appreciated that different volume ratios or weight percents can be used in other embodiments without departing from the scope of the present invention. Moreover, the oxidation potential of the solution formed is preferably at least 1150 mV and is approximately 1180–1230 mV to ensure optimum solubility of ruthenium silicide. Furthermore, although potassium hypochlorite is used in the preferred embodiment, any other hypochlorite based salt such as sodium hypochlorite, calcium hypochlorite, or the like can be used in place of potassium hypochlorite without departing from the scope of the invention.

In the preferred embodiment, the potassium hypochlorite and hydrofluoric acid used are industrial grade off-the-shelf aqueous solutions with concentration levels of approximately 11% and 49% respectively. However, it can be appreciated that KOCl and HF at different concentration levels can also be used without departing from the scope of the invention. Furthermore, the hypochlorite salt based solution of the preferred embodiment is prepared using well known laboratory techniques and the sequence of ingredient addition comprises diluting HF with D.I. water prior to adding the hypochlorite salt in order to reduce the escape of chlorine gas from solution. Furthermore, it can be appreciated that other acid solutions can be used in place of HF without departing from the scope of the invention.

In one embodiment, the $RuSi_x$ is immersed in the solution for approximately 3 minutes to dissolve a layer of $RuSi_x$ that is approximately 1000 Å thick. However, it can be appreciated that the immersion time can vary in other embodiments depending on the location and thickness of the ruthenium silicide to be removed. Preferably, the first step 102 is performed in an open tank that is commonly used in wet chemistry processing and is conducive to batch processing and overall ease of operation. Also, this step can be performed in any available aqueous process tool, including spray-process, spin-etch and brush scrub. As it is also shown in FIG. 1, the immersion step is followed by a second step 104 in which the etched surface is removed from the solution. Advantageously, the solution is formulated to etch $RuSi_x$ at a substantially faster rate than it can remove other materials on the substrate surface such as oxide layers or the like. As such, the process of the preferred embodiment is able to selectively dissolve ruthenium silicide from the substrate surface without requiring masking the non-$RuSi_x$ areas on the substrate. Preferably, after the $RuSi_x$ is substantially dissolved, the substrate is removed from the solution using a method well known in the art. Preferably, the substrate is removed from the solution immediately following the completion of $RuSi_x$ etching because prolonged exposure to the solution may adversely affect other material formed on the substrate. As it is shown in FIG. 1, the immersion step is followed by a second step 104 in which the etched surface is rinsed with an aqueous solution such as D.I. water so as to remove any residue etchant from the surface.

Figure 2:
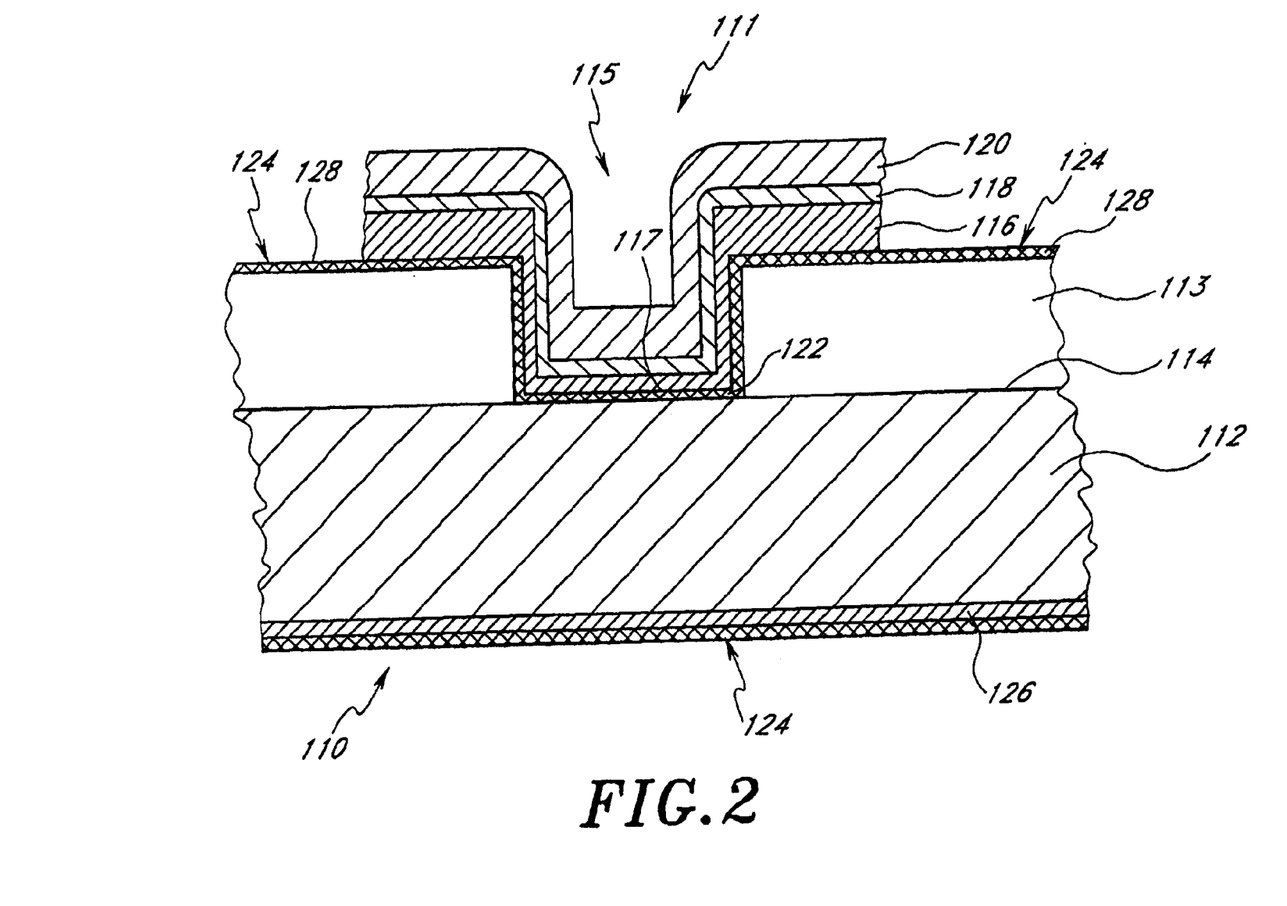
FIG. 2 is a partial elevational cross-sectional view of a partially fabricated integrated circuit or substrate assembly, showing a conventional capacitor structure formed on a substrate surface prior to the etching process of FIG. 1.

FIG. 2 illustrates a partially fabricated integrated circuit or substrate assembly 110 wherein the structure is formed above a substrate 112, which may comprise a single crystal wafer or other semiconductive layer in which active or operable portions of the electrical devices are formed. In particular, the substrate assembly 110 of the illustrated embodiment represents, for example, a conventional capacitor structure 111 for a dynamic random access member (DRAM) circuit. As FIG. 2 shows, a layer of insulating oxide 113 is first formed on an upper surface 114 of the substrate 112 using a known deposition method. Furthermore, an opening 115 is formed in the insulating oxide layer 113 using a known etch process so as to expose a portion 117 of the upper surface 114 of the substrate 112 for the formation of the capacitor structure 111.

As FIG. 2 further illustrates, the capacitor structure 111 is formed on the exposed portion 117 of the top surface 114 of the substrate 112. In particular, the capacitor structure 111 is positioned substantially within the opening 115 formed in the insulating oxide layer 113. As it is generally known, the capacitor structure 111 typically comprises a bottom electrode 116, a dielectric layer 118, and a top electrode 120. In one embodiment, the electrodes 116, 120 may be made from a known metal such as platinum or ruthenium oxide, while the dielectric layer 118 may comprise a high-k dielectric material, such as tantalum pentoxide, barium strontium titanate, barium titanate, or the like.

As FIG. 2 further shows, a ruthenium silicide liner 122 is preferably interposed between the exposed substrate surface 117 and the bottom electrode 116 of the capacitor structure 111. In particular, the ruthenium suicide liner 122 inhibits silicon in the substrate 112 from diffusing upwardly into the bottom electrode 116. A detailed description of using Ruthenium Suicide as a silicon diffusion barrier is disclosed in U.S. Pat. No. 6,197,628 which is also assigned to Micron Technology. Preferably, the ruthenium silicide liner 122 is approximately 1000 Å thick and can be deposited onto the substrate surface using a known deposition method such as chemical vapor deposition (CVD).

Disadvantageously, however, the $RuSi_x$ deposition process often leaves excess ruthenium silicide 124 on unmasked areas of the substrate assembly 110. As FIG. 2 shows, excess ruthenium silicide 124 is deposited on a bottom surface 126 of the substrate 112 and a top surface 128 of the insulating oxide 113. It can be appreciated that such excess $RuSi_x$ can also be deposited in recessed locations on the substrate or even on tools that are used during the deposition process. Generally, the excessive ruthenium silicide 124 has to be removed from the substrate assembly 110 prior subsequent processing steps. However, prior to the present invention, there is no known method of effectively removing ruthenium silicide which has substantially limited the application of using $RuSi_x$ in semiconductor fabrication.

Figure 3:
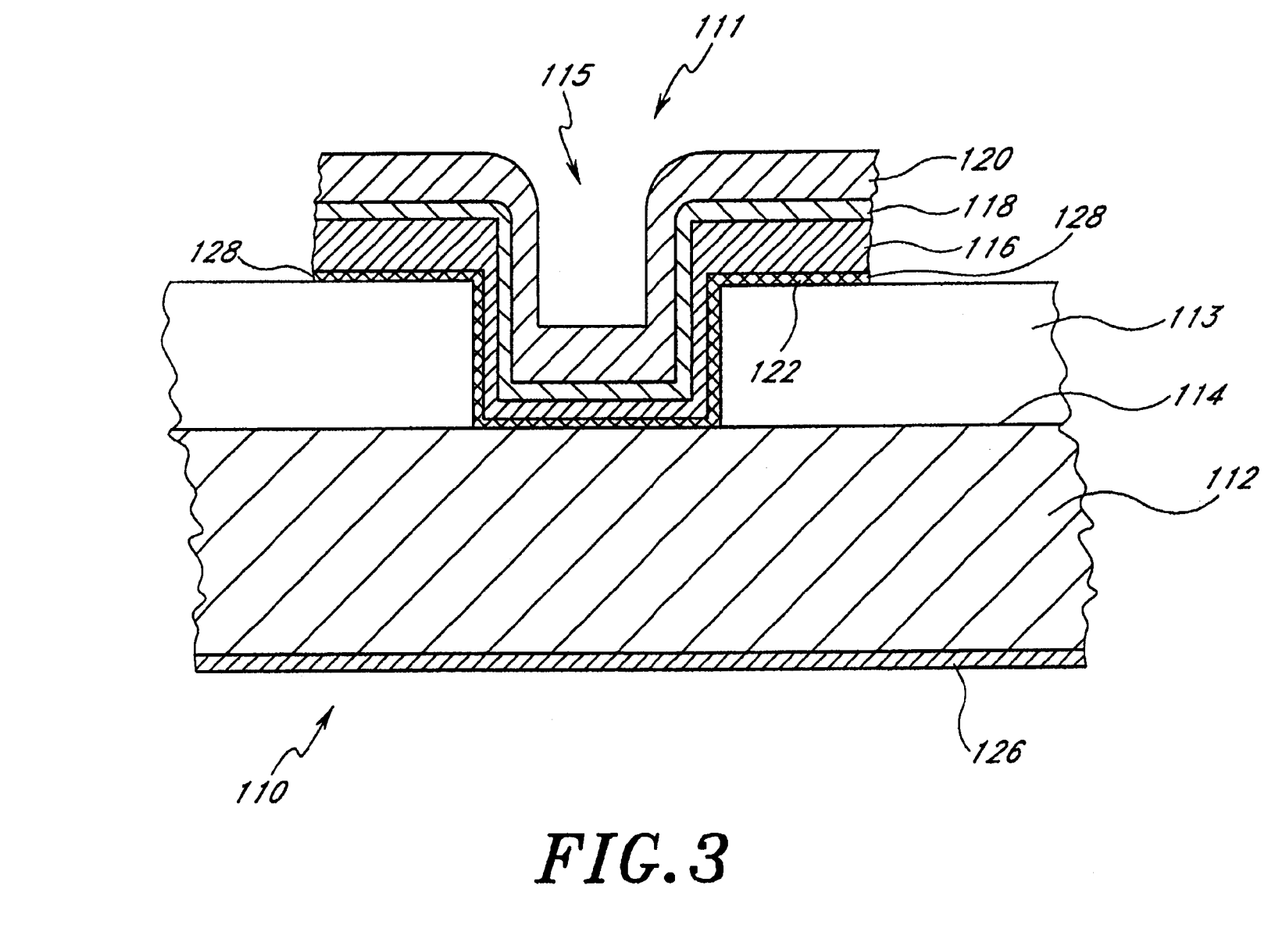
FIG. 3 shows the capacitor structure of FIG. 2 subsequent to the etching process of FIG. 1.

As described in greater detail above, the present invention provides a novel method of selectively removing $RuSi_x$ from a substrate surface without affecting other layers of material deposited on the substrate surface 114. In particular, the method comprises exposing the substrate surface containing ruthenium silicide to a hypochlorite salt based solution. Preferably, the solution is applied to the substrate surface using a well known immersion or spray technique. After exposing the substrate to the hypochlorite solution for a predetermined amount of time, the solution will dissolve the ruthenium silicide without attacking other material on the substrate surface. In one embodiment, the hypochlorite salt based solution comprises a 11% potassium hypochlorite solution combined with a 49% hydrofluoric acid and D.I. water in a 3:1:50 ratio respectively. In particular, the substrate surface is preferably immersed to the solution for approximately 3 minutes to effectively dissolve ruthenium silicide that is approximately 1000 Å thick. However, the immersion time may vary in other embodiments depending on the thickness of the RuSi$_x$ and its location on the substrate surface. As FIG. 3 shows, the excess ruthenium silicide is selectively removed from the bottom surface 126 of the substrate 112 and the top surface 128 of the insulating oxide layer 113 following the application of the etching process of the preferred embodiment.

Advantageously, the present invention provides a method of selectively removing ruthenium silicide from a substrate surface without requiring additional masking steps to protect the non-RuSi$_x$ surfaces. As it can be appreciated, the elimination of the masking steps reduces the overall manufacturing cost as well as the risk of incurring product defects. Furthermore, the method can be applied to removing ruthenium silicide not only from substrate surfaces but also from surfaces on tools or equipment associated with the deposition process. For instance, the process can be used to dissolve ruthenium silicide deposited on the clamping tools used to hold the wafer in place during deposition. Furthermore, the process is simple to implement and can be easily adapted to existing wet etch equipment.

Figure 4:
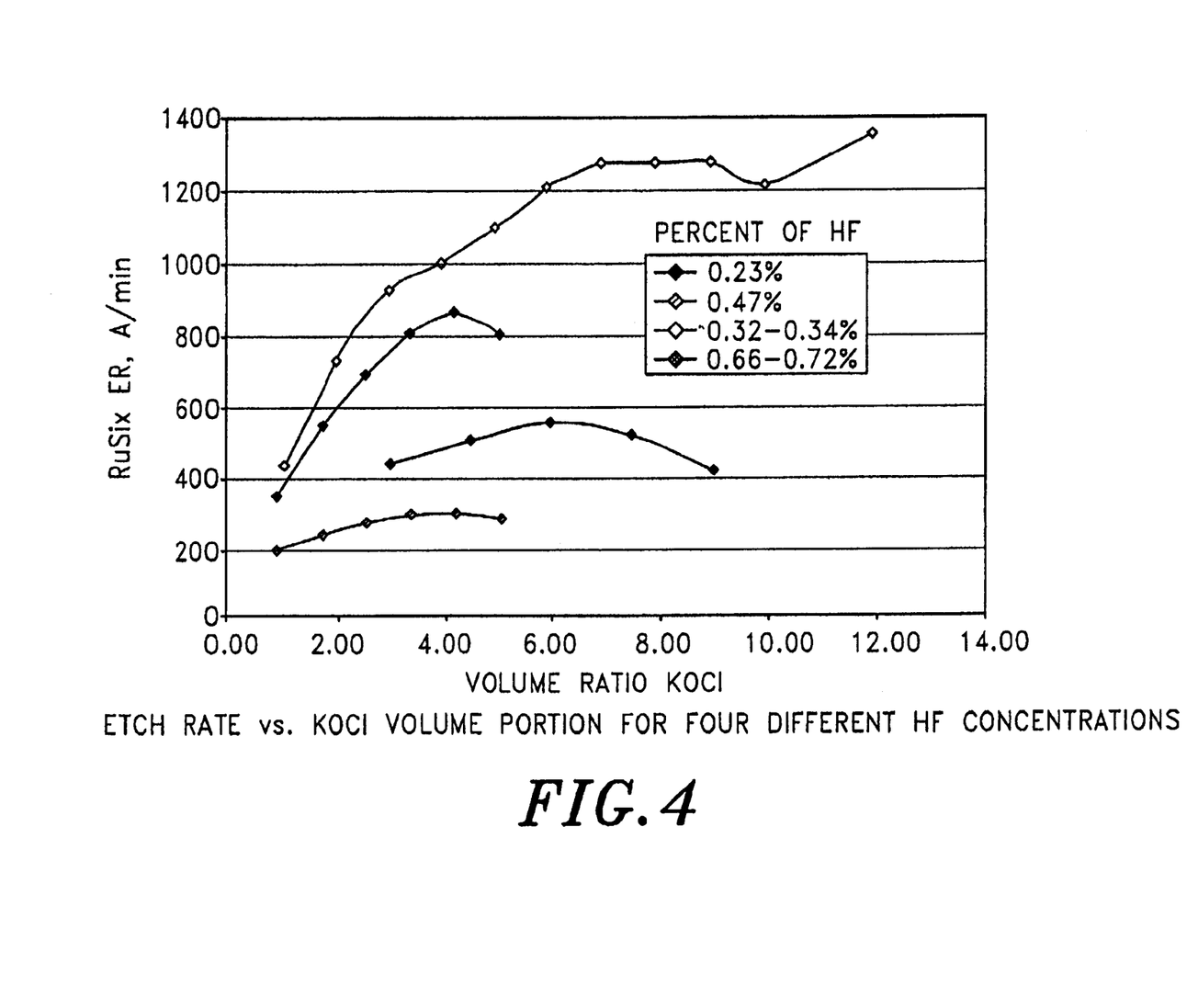
FIG. 4 is a chart illustrating a relationship between the etch rate of ruthenium silicide and various KOCl volume portions at different HF concentrations when using the process of FIG. 1.
Figure 5:
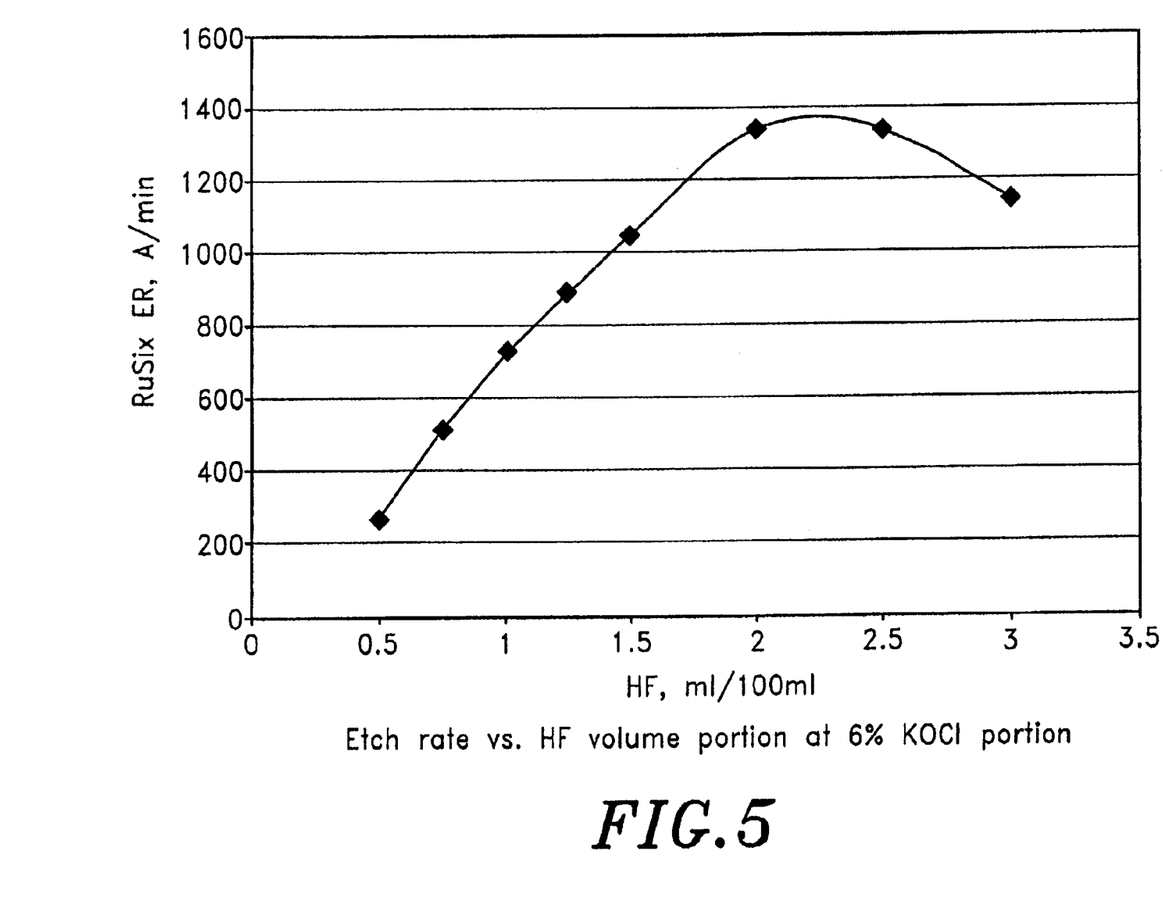
FIG. 5 is a chart illustrating a relationship between the etch rate of ruthenium silicide and various HF volume portions at 6% KOCl volume portion when using the process of FIG. 1.

Furthermore, the present invention also provides a method of adjusting the etch rate of ruthenium silicide by varying the concentrations of the solution. FIG. 4 illustrates a graph representing the etch rates attained using different KOCl volume portions in four different HF concentrations. As FIG. 4 shows, the etch rate of ruthenium silicide experiences a steady increase as the KOCl volume portion continues to increase in an approximately 0.66–0.73% HF solution. Furthermore, FIG. 5 is a graph showing the various etch rates achievable using different HF volume portions combined with a 6% KOCl. As FIG. 5 shows, in one embodiment, the highest etch rate can be attained when the solution comprises approximately 0.98% HF and 6% KOCl by volume. It can be appreciated that the graphs shown in FIGS. 4 and 5 are merely illustrative examples of the etch rates attained at a few exemplary etchant concentrations. It can also be appreciated that a variety of different solution parameters can be adopted to vary the etch rate without departing from the scope of the invention.

Although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the invention. Consequently, the scope of the present invention should not be limited to the foregoing discussions, but should be defined by the appended claims.

What is claimed is:

1. An etchant used to remove ruthenium suicide from a surface, comprising an aqueous mixture of chlorine- and fluorine-containing chemicals wherein the mixture is applied to the surface in a manner such that the mixture is adapted to react with the ruthenium suicide to produce water-soluble reaction products; and wherein the aqueous mixture comprises a hypochlorite salt based solution combined with hydrofluoric acid and D.I. water in the volume ratio of about 3:1:50.

2. An etchant, comprising:

about 0.1–1.0% by weight of a hypochlorite based salt;

about 0.2–2.0% by weight of acid;

and balance D.I. water; and wherein the etchant is applied to a first surface containing ruthenium silicide and is adapted to react with the ruthenium silicide to produce water-soluble reaction products so as to permit select removal of ruthenium suicide from the first surface.

3. The etchant of claim 2 wherein the hypochlorite based salt comprises potassium hypochlorite (KOCl).

4. The etchant of claim 2 wherein the hypochlorite based salt comprises sodium hypochlorite.

5. An etchant used to remove ruthenium suicide from a substrate surface, comprising approximately 0.1–1.0% potassium hypochlorite (KOCl), 0.2–2.0% hydrofluoric acid (HF), and balance D.I. water by weight.

* * * * *

UNITED STATES PATENT AND TRADEMARK OFFICE
CERTIFICATE OF CORRECTION

PATENT NO. : 6,740,252 B2  Page 1 of 1
DATED : May 25, 2004
INVENTOR(S) : Brenda D. Kraus et al.

It is certified that error appears in the above-identified patent and that said Letters Patent is hereby corrected as shown below:

Column 1,
Line 6, delete "Suicide" and insert -- Silicide --.

Column 5,
Lines 4-5, delete "(KOC1 HF D.I. H$_2$O)" and insert -- (KOCl / HF / D.I. H$_2$O) --.

Column 6,
Line 27, delete "suicide" and insert -- silicide --.
Line 30, delete "Suicide" and insert -- Silicide --.

Column 8,
Lines 12, 16, 30 and 35, delete "suicide" and insert -- silicide --.

Signed and Sealed this

Sixteenth Day of May, 2006

JON W. DUDAS
*Director of the United States Patent and Trademark Office*